United States Patent
Kushnir et al.

(10) Patent No.: US 12,334,926 B2
(45) Date of Patent: Jun. 17, 2025

(54) DUTY CYCLE DISTORTION (DCD) SAMPLING IN A LOW-SWING TRANSMITTER

(71) Applicant: Mellanox Technologies, Ltd., Yokneam (IL)

(72) Inventors: Igal Kushnir, Hod Hasharon (IL); Naor Peretz, Kiryat Ata (IL); Roi Levi, Bruchin (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 18/398,779

(22) Filed: Dec. 28, 2023

(65) Prior Publication Data

US 2024/0128954 A1    Apr. 18, 2024

Related U.S. Application Data

(63) Continuation of application No. 17/884,878, filed on Aug. 10, 2022, now Pat. No. 11,894,847.

(51) Int. Cl.
| | |
|---|---|
| *H03K 3/017* | (2006.01) |
| *H03K 19/0185* | (2006.01) |
| *H03K 19/17784* | (2020.01) |
| *H04L 25/03* | (2006.01) |

(52) U.S. Cl.
CPC ..... *H03K 3/017* (2013.01); *H03K 19/018521* (2013.01); *H03K 19/17784* (2013.01); *H04L 25/03878* (2013.01)

(58) Field of Classification Search
CPC .......... H03K 3/017; H03K 19/018521; H03K 19/1778; H04L 25/03878; H04L 25/03885
See application file for complete search history.

(56) References Cited

U.S. PATENT DOCUMENTS

| | | |
|---|---|---|
| 6,163,174 A | 12/2000 | Friedman et al. |
| 8,311,502 B2 | 11/2012 | Yamakawa |
| 8,462,906 B1 | 6/2013 | Ding |
| 10,164,600 B2 | 12/2018 | Kormann et al. |
| 11,115,177 B2 | 9/2021 | Ke et al. |

*Primary Examiner* — Menatoallah Youssef
*Assistant Examiner* — Colleen J O Toole
(74) *Attorney, Agent, or Firm* — Lowenstein Sandler LLP

(57) ABSTRACT

Technologies for duty cycle distortion (DCD) estimation are described. A transmitter includes a first output driver comprising a first complementary metal-oxide semiconductor (CMOS) amplifier and a first attenuator coupled to an output of the first CMOS amplifier. The first CMOS amplifier receives an input signal and outputs an intermediate signal to the first attenuator. The first attenuator receives the intermediate signal and outputs an output signal having a signal swing that is less than a signal swing of the input signal. A first duty cycle correction (DCC) loop is coupled to the first output driver. The first DCC loop estimates first DCD in the intermediate signal output by the first CMOS amplifier.

20 Claims, 6 Drawing Sheets

DUTY CYCLE DISTORTION (DCD) SAMPLING IN A LOW-SWING TRANSMITTER

RELATED APPLICATIONS

This application is a continuation of U.S. patent application Ser. No. 17/884,878, filed Aug. 10, 2022, the entire contents of which are incorporated by reference.

TECHNICAL FIELD

At least one embodiment pertains to processing resources used to perform and facilitate chip-to-chip (C2C) communication. For example, at least one embodiment pertains to duty cycle distortion (DCD) sampling in a low-swing transmitter of a C2C Serializer/Deserializer (SERDES) interface.

BACKGROUND

Communications systems transmit and receive signals at a high data rate (e.g., up to 100 Gbits/sec). Two separate integrated circuits (also referred to as chips) can communicate with one another over chip-to-chip (C2C) SERDES interfaces. Some C2C regulations, like High Bandwidth Memory (HBM) and High Bandwidth Interface (HBI), have tried to address interfaces with low power and high throughput. A low-swing N-over-N output driver is a conventional approach in a C2C SERDES interface. There are two major problems with the N-over-N output driver. In order to generate the low swing transmit signal (TX signal), an additional low voltage supply is required (V=0.4V). This is a major drawback since additional wafer bumps are required. In HBI, every $7^{th}$ bump is used for the additional low voltage supply, reducing the possible interface throughput. Due to the structure of the N-over-N output driver, the rise and fall times of a low swing output signal are inherently different, meaning that the output signal is not symmetric. As the baud of the C2C SERDES interface increases, the duty cycle distortion (DCD) becomes a limiting factor. The conventional approach needs to estimate the DCD and calibrate accordingly to correct for the DCD, referred to as duty cycle correction (DCC). The DCC methods, however, can introduce additional DCD, thus degrading the overall TX DCC. Additional DCC approaches can require additional asynchronous sampling in the system. Swapping between the real sampling clock (CLK) and the asynchronous CLK can lead to high system complexity. Also, this approach requires loopback between the transmitter and receiver and a long time to achieve good resolution.

BRIEF DESCRIPTION OF DRAWINGS

Various embodiments in accordance with the present disclosure will be described with reference to the drawings, in which.

DETAILED DESCRIPTION

Technologies for duty cycle distortion (DCD) sampling in low-swing transmitters are described. As described above, DCD is a limiting factor for increasing the baud of a C2C SERDES interface. Conventional approaches that estimate and correct DCD are deficient in addressing this problem and can add to the DCD and complexity of the design.

More specifically, a transmitter (TX) DCD algorithm can sample an output signal of an N-over-N output driver and apply one of the following methods for DCC, including full swing complementary metal-oxide semiconductor (CMOS) processing, analog filter, or asynchronous statistical sampling. For full-swing CMOS processing, in order to process the signal with a CMOS stage, the signal needs to be amplified to CMOS levels. This operation by itself can add DCD, thus degrading the overall TX DCC. For analog filtering, the average of the signal can be estimated using an analog low pass filter (LPF) in order to estimate the TX DCD. As explained before, the signal might be non-symmetric in an N-over-N transmitter, thus degrading the overall TX DCC. Moreover, such an LPF might load the N-over-N transmitter during the test and degrade the operation. If the signal is buffered, the buffer might add DCD. For asynchronous statistical sampling, the data symbols are sampled with an asynchronous sampling clock. The output is fed to a counter. In the case where the symbols have no DCD, the '1' and '0' ratio at the output would be the same. In general, this ratio is proportional to the DCD. The drawback of this method is that it requires an additional asynchronous sampling signal in the system and requires swapping between the real sampling clock and the asynchronous clock, which can lead to high system complexity. Also, this method requires loopback between the TX and receiver (RX) and a long time to achieve good resolution.

Aspects and embodiments of the present disclosure address these and other challenges by providing a low-swing transmitter and DCD sampling without adding hardware that might affect the measured DCD. Aspects and embodiments of the present disclosure can provide a low-swing SERDES transmitter (e.g., HBM, HBI, etc.) and a method of sampling the DCD in the low-swing SERDES transmitter. Aspects and embodiments of the present disclosure can provide a low-swing transmitter without an additional low voltage supply. Aspects and embodiments of the present disclosure can provide a DCD correction loop via a reliable sampling point in the low-swing transmitter.

Figure 1:
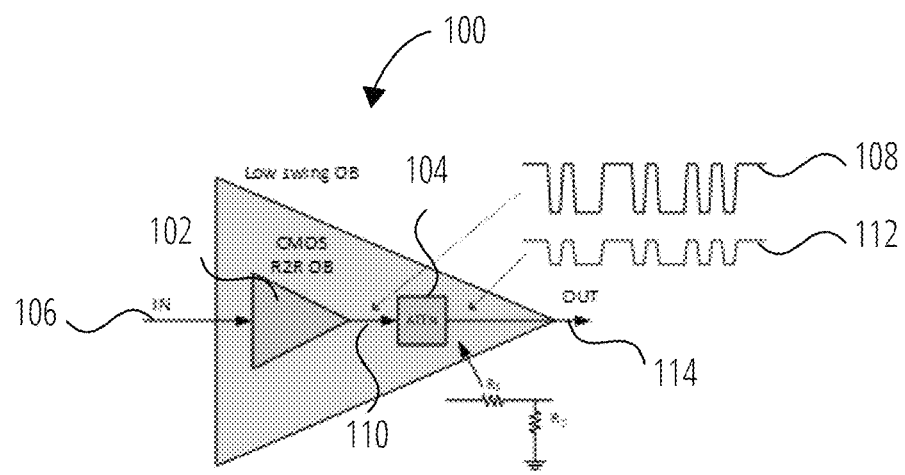
FIG. 1 is a circuit diagram of a low-swing output driver (OB) according to at least one embodiment.

FIG. 1 is a circuit diagram of a low-swing output driver 100 (also referred to as low-swing OB) according to at least one embodiment. The low-swing output driver 100 can be part of a C2C transmitter. The low-swing output driver 100 includes an output driver 102 and an attenuator 104. The output driver 102 can receive an input signal 106 and output an intermediate signal 108 corresponding to the input signal 106 on an output node 110. The input signal 106 includes a first signal swing corresponding to a supply voltage of the output driver 102. That is, the output driver 102 can be considered a high-swing output driver (e.g., CMOS rail-to-rail (R2R) OB). The input signal 106 can be a data signal or a clock signal. The attenuator 104 is coupled to the output node 110 of the output driver 102. The attenuator 104 can receive the intermediate signal 108 and output an output signal 112. The output signal 112 includes a second signal swing that is less than the first signal swing. As described below with respect to FIG. 3, a duty cycle correction (DCC) loop is coupled to the output node 110 of the output driver 102. The DCC loop can sample the intermediate signal 108 at the output node 110 of the output driver 102 to estimate and correct for DCD at the output node 110, instead of an output node 114 of the low-swing output driver 100.

In most C2C SERDES systems, an output driver (OB) is the highest power-consuming block. The output driver drives the data through a channel to a receiver (RX), thus driving a high capacitance, leading to high dynamic power consumption (DPC). The DPC of the low-swing output driver 200 is the power required for charging and discharging an OB load capacitance, represented by a capacitor 210, and it is proportional to a squared output voltage of the low-swing output driver 200, $V^2_{OUT\_OB}$. Thus, lowering the OB output voltage ($V_{OUT\_OB}$) would lower the DPC.

In conventional approaches in HBM and HBI, lowering $V_{OUT\_OB}$ is done by an N-over-N OB design and a dedicated low voltage supply. These dedicated supply bumps lower the overall number of data bumps, thus lowering the overall throughput of the interconnect. The low-swing output driver 100 enables a low swing OB, with no dedicated low voltage supply, using a combination of a high-swing output driver 102 and the attenuator 104 to lower the output swing.

In at least one embodiment, the attenuator 104 is a resistive attenuator, such as implemented as a resistor divider network as illustrated in FIG. 1. The idea can also be implemented with a high-swing driver and a passive CTLE circuit, such as illustrated in FIG. 2, which allows equalization of the transmitter response.

Figure 2:
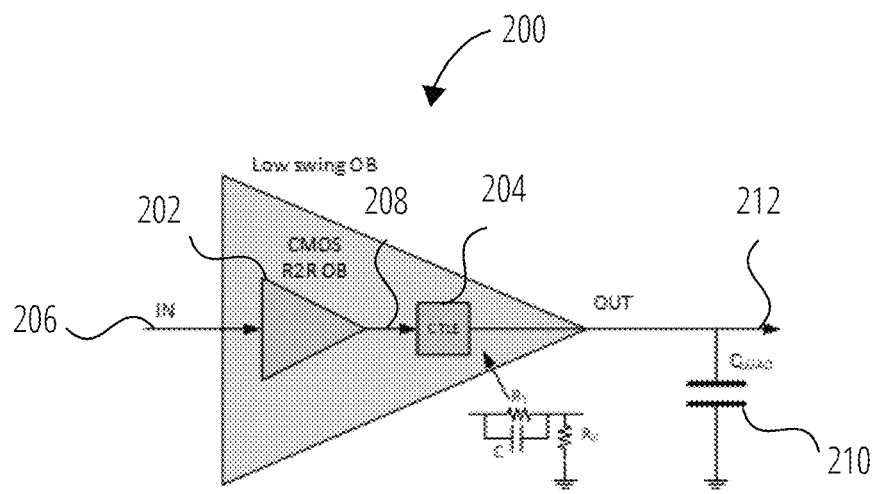
FIG. 2 is a circuit diagram of a low-swing output driver with a passive continuous-time linear equalization (CTLE) circuit according to at least one embodiment.

FIG. 2 is a circuit diagram of a low-swing output driver 200 with a passive CTLE circuit according to at least one embodiment. The low-swing output driver 200 can be part of a C2C transmitter. The low-swing output driver 200 includes an output driver 202 (e.g., high-swing output driver) and a passive CTLE circuit 204. The output driver 202 can receive an input signal 206 and output an intermediate signal 208 corresponding to the input signal 206 on an output node of the output driver 202. The input signal 206 includes a first signal swing corresponding to a supply voltage of the output driver 202. The passive CTLE circuit 204 is coupled to the output node of the output driver 202. The passive CTLE circuit 204 can receive the intermediate signal 208 and output an output signal 212. The output signal 212 includes a second signal swing that is less than the first signal swing. The low-swing output driver 200 enables a low swing OB, with no dedicated low voltage supply, using a combination of a high-swing output driver 102 and the passive CTLE circuit 204 to lower the output swing.

As described below with respect to FIG. 3, a DCC loop is coupled to the output node of the output driver 202. The DCC loop can sample the intermediate signal 208 at the output node of the output driver 202 to estimate and correct for DCD at the output node, instead of an output node of the low-swing output driver 200.

In conventional N-over-N low-swing output drivers, the task of estimating the DCD from the output signal can be challenging. The DCD estimation of the output signal with CMOS circuits (e.g., time to digital (TDC)), requires levels shifting the low-swing signal to CMOS levels used by the DCD estimation block. This level shifting usually distorts the DCD that needs to be estimated due to self-induced DCD. Direct estimation of the DCD by averaging (e.g., using an analog LPF) is also challenging since the average of an analog clock signal is equal to the DCD only if the waveform is symmetric with the same rise and fall times, which is not the case for the N-over-N design that is asymmetric. In at least one embodiment, these problems can be solved by sampling the signal and estimating the DCD before the passive CTLE (or attenuator) directly at the output of the high-swing CMOS driver, as described below with respect to FIG. 3 and FIG. 4.

Figure 3:
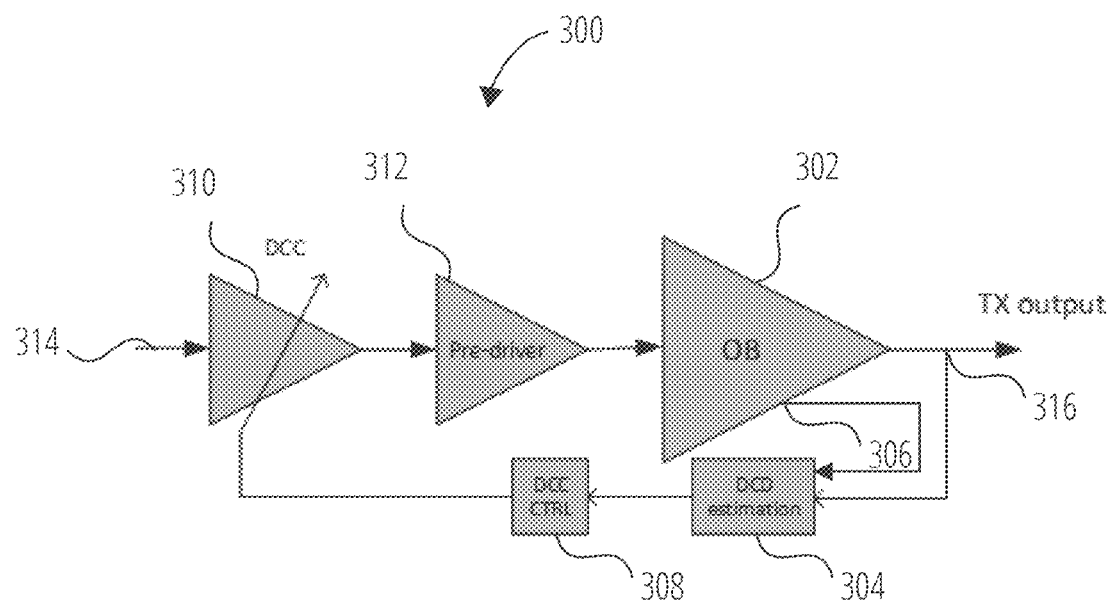
FIG. 3 is a circuit diagram of a duty cycle correction (DCC) loop coupled to a low-swing output driver, according to at least one embodiment.

FIG. 3 is a circuit diagram of a DCC loop 300 coupled to a low-swing output driver 302, according to at least one embodiment. The low-swing output driver 302 can be low-swing output driver 100 or low-swing output driver 200. The DCC loop 30 and the low-swing output driver 302 can be implemented in a TX SERDES interface. In at least one embodiment, the DCC loop 300 includes a DCD estimation block 304 coupled to an intermediate node 306 of the low-swing output driver 302, a DCC control block 308 coupled to the DCD estimation block 304, and a DCC component 310 coupled to the DCC control block 308 and the low-swing output driver 302. In at least one embodiment, a pre-driver 312 is coupled between the DCC component 310 and the low-swing output driver 302. In a further embodiment, the DCC component 310 can receive an input signal from a serializer (not illustrated in FIG. 3).

During operation, the low-swing output driver 302 receives the input signal 314 via the DCC component 310 and the pre-driver 312. The low-swing output driver 302 attenuates the input signal 314 to produce an output signal on output node 316. The output signal is a low-swing signal and the input signal 314 is a high-swing signal. The high-swing signal corresponds to a supply voltage of the low-swing output driver 302. The output signal has a lower swing than the input signal because of the attenuator of the low-swing output driver 302, as described above. In at least one embodiment, the DCD estimation block 304 can sample an intermediate signal at the intermediate node 306 of the low-swing output driver 302 and estimate an amount of DCD in the intermediate signal. The intermediate node 306 can correspond to the output node of the high-swing output driver that is coupled to the attenuator, as described and illustrated with respect to FIG. 4. In at least one embodiment, the DCD estimation block 304 can sample the output signal at output node 316, but would need to use level shifters, which could add to the complexity of the DCC loop 300 and introduce some DCD as described above.

In at least one embodiment, the DCD estimation block 304 can provide a DCD estimate to the DCC control block 308. The DCC control block 308 uses the DCD estimate to control the DCC component 310 to compensate for the DCD in the input signal 314. In this manner, the low-swing output driver 302 can output a compensated output signal at the output node 316. That is, the DCD in the output signal can be removed or reduced. As described above, the DCC loop 300 addresses the problematic combination of low-swing TX and the need to calibrate the TX DCD. The DCC loop 300 can solve the problems described herein by sampling the signal and estimating the DCD before the passive CTLE (or attenuator) directly at the output of the high-swing CMOS driver, as illustrated in FIG. 4.

Figure 4:
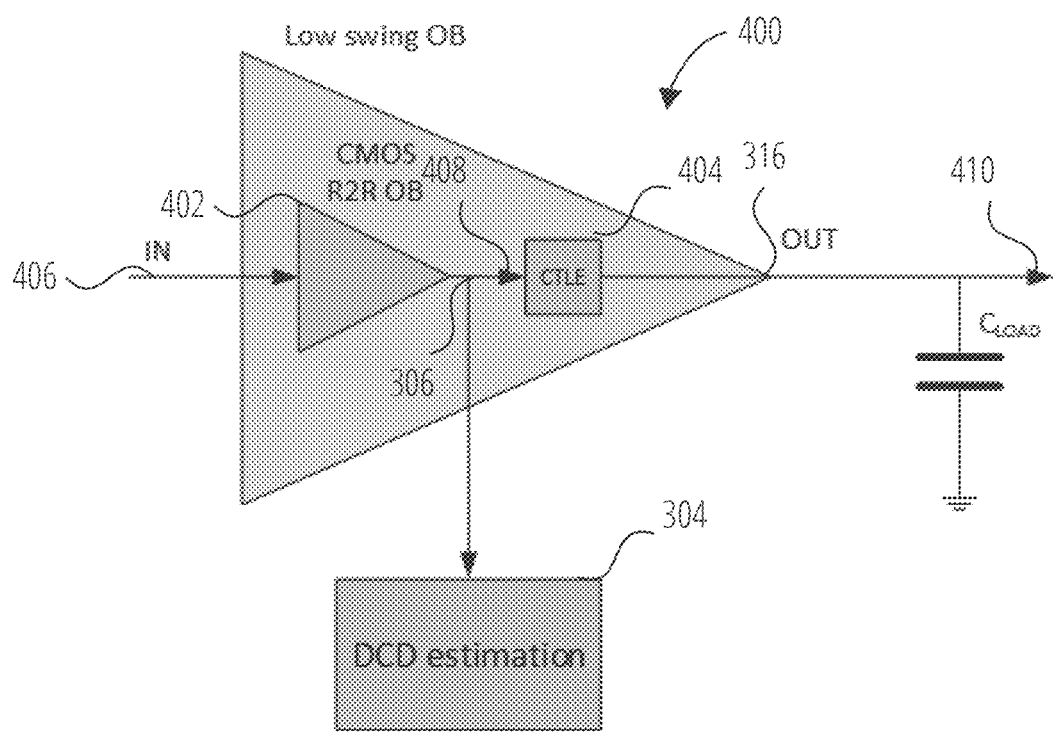
FIG. 4 is a circuit diagram of a low-swing output driver with an intermediate node for a DCD estimation point according to at least one embodiment.

FIG. 4 is a circuit diagram of a low-swing output driver 400 with an intermediate node 306 for a DCD estimation point according to at least one embodiment. The low-swing output driver 400 can be part of a C2C transmitter. The low-swing output driver 400 includes a high-swing output driver 402 and a passive CTLE circuit 404. The output driver 402 can receive an input signal 406 and output an intermediate signal 408 corresponding to the input signal 406 on the intermediate node 306, which is an output node of the output driver 402. The input signal 406 includes a first signal swing corresponding to a supply voltage of the output driver 402. The passive CTLE circuit 404 is coupled to the intermediate node 306. The passive CTLE circuit 404 can receive the intermediate signal 408 and output an output signal 410. The output signal 410 includes a second signal swing that is less than the first signal swing. The low-swing output driver 400 enables a low-swing OB, with no dedicated low voltage supply, using a combination of a high-swing output driver 402 and the passive CTLE circuit 404 to lower the output swing.

As described above, the DCD estimation block 304 is coupled to the intermediate node 306. The DCD estimation block 304 can sample the intermediate signal 408 at the intermediate node 306, which is the output node of the output driver 202. The DCD estimation block 304 can estimate DCD in the input signal 406. The DCD estimation block 304 can sample the intermediate signal 408 at the intermediate node 306, instead of the output signal 410 at the output node 316 of the low-swing output driver 400. Due to the fact that the circuitry of the attenuator (e.g., passive CTLE circuit) at the output of the high-swing output driver 402 (e.g., CMOS OB) is passive, it does not affect the DCD and represents the exact DCD at the output of the C2C transmitter. As described above, the DCD estimation block 304 can be part of a DCC loop that can correct the input signal to compensate for the DCD estimated by the DCD estimation block 304.

In at least one embodiment, using the low-swing output driver 400 in a transmitter, the power can be reduced due to the low output swing, and there can be relatively small DCD caused by the CMOS design. The DCD estimation point can be an optimal detection point due to the full swing output of the output driver 402 before attenuation. The DCD estimation point can improve the DCD correction methods using the DCC loop.

Figure 5:
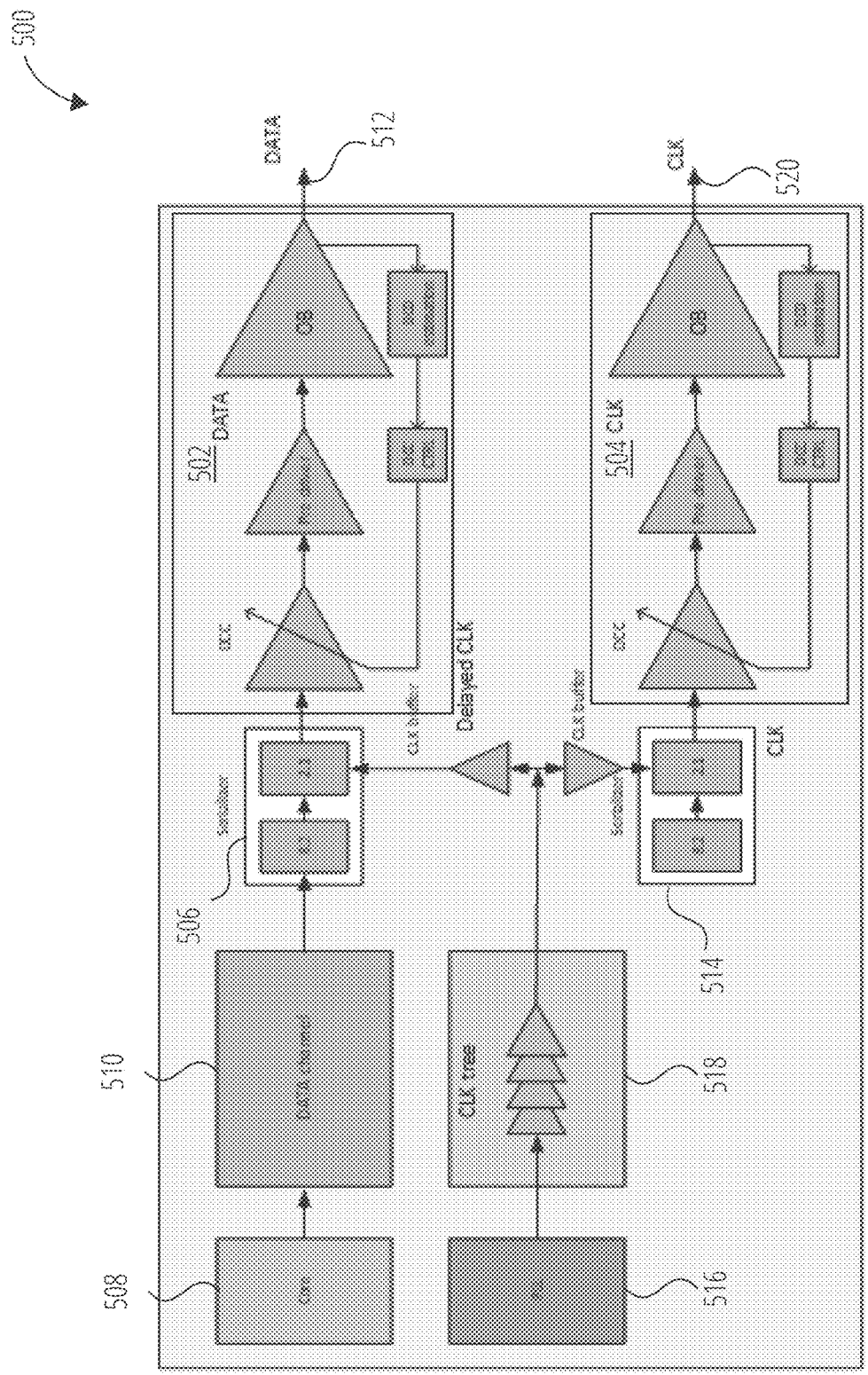
FIG. 5 is a circuit diagram of a device with two low-swing output drivers according to at least one embodiment.

FIG. 5 is a circuit diagram of a device 500 with two low-swing output drivers according to at least one embodiment. The device 500 includes a low-swing output driver 502 and a low-swing output driver 504. The low-swing output driver 502 and low-swing output driver 504 can be part of a single C2C transmitter or two separate C2C transmitters. The low-swing output driver 502 can be used to send a data signal, and the low-swing output driver 504 can be used to send a clock signal. In other embodiments, the device 500 can send either the data signal or the clock signal.

In at least one embodiment, the device 500 includes a first serializer 506 coupled to low-swing output driver 502 (e.g., the DCC component). The first serializer 506 can receive a data signal from a core (e.g., a central processing unit (CPU), a graphics processing unit (GPU), or other processing circuitry) via a data channel 510. The first serializer 506 can serialize the data signal into an input signal received by the low-swing output driver 502. The low-swing output driver 502 can provide an output data signal 512. In one embodiment, the first serializer 506 and the low-swing output driver 502 make up a data transmitter.

In at least one embodiment, the device 500 includes a second serializer 514 coupled to low-swing output driver 504 (e.g., the DCC component). The second serializer 514 can receive a clock signal from a phased locked loop 516 (or other clock sources) via a clock tree 518. The second serializer 514 can serialize the clock signal into an input signal received by the low-swing output driver 504. The low-swing output driver 504 can provide an output clock signal 520. In one embodiment, the second serializer 514 and the low-swing output driver 504 make up a clock transmitter.

In at least one embodiment, the device 500 can be a source synchronous C2C transmitter in which the clock signal from the clock tree 518 can be buffered and used to clock the first serializer 506 and the second serializer 514. The scheme includes synchronous a data transmitter (e.g., 502) and a clock transmitter (e.g., 504), meaning that the data and clock symbols are generated via a common clock source (e.g., phased locked loop 516), which drives the serializers of the data and clock transmitters. In at least one embodiment, clock buffers can be used to buffer the clock signal for clocking the first serializer 506 and the second serializer 514.

It should be noted that FIG. 5 also illustrates the DCC loops in both transmitters. The DCD correction loops are based on a DCD estimation block, DCC control block, and DCC component as described above. It should be noted that although only one data transmitter is illustrated, the device 500 can include multiple data transmitters for each clock transmitter. In another embodiment, the device 500 can include multiple clock transmitters.

As described herein, conventional approaches in HBM and HBI use a dedicated low voltage supply for the N-over-N output driver design, resulting in dedicated supply bumps. These dedicated supply bumps lower the overall number of data bumps, thus lowering the overall throughput of the interconnect. The device 500 does not include a dedicated low voltage supply, allowing supply bumps with additional C2C I/O bumps, increasing the interface throughput, such as by approximately 16% as compared to conventional N-over-N output driver designs.

Figure 6A:
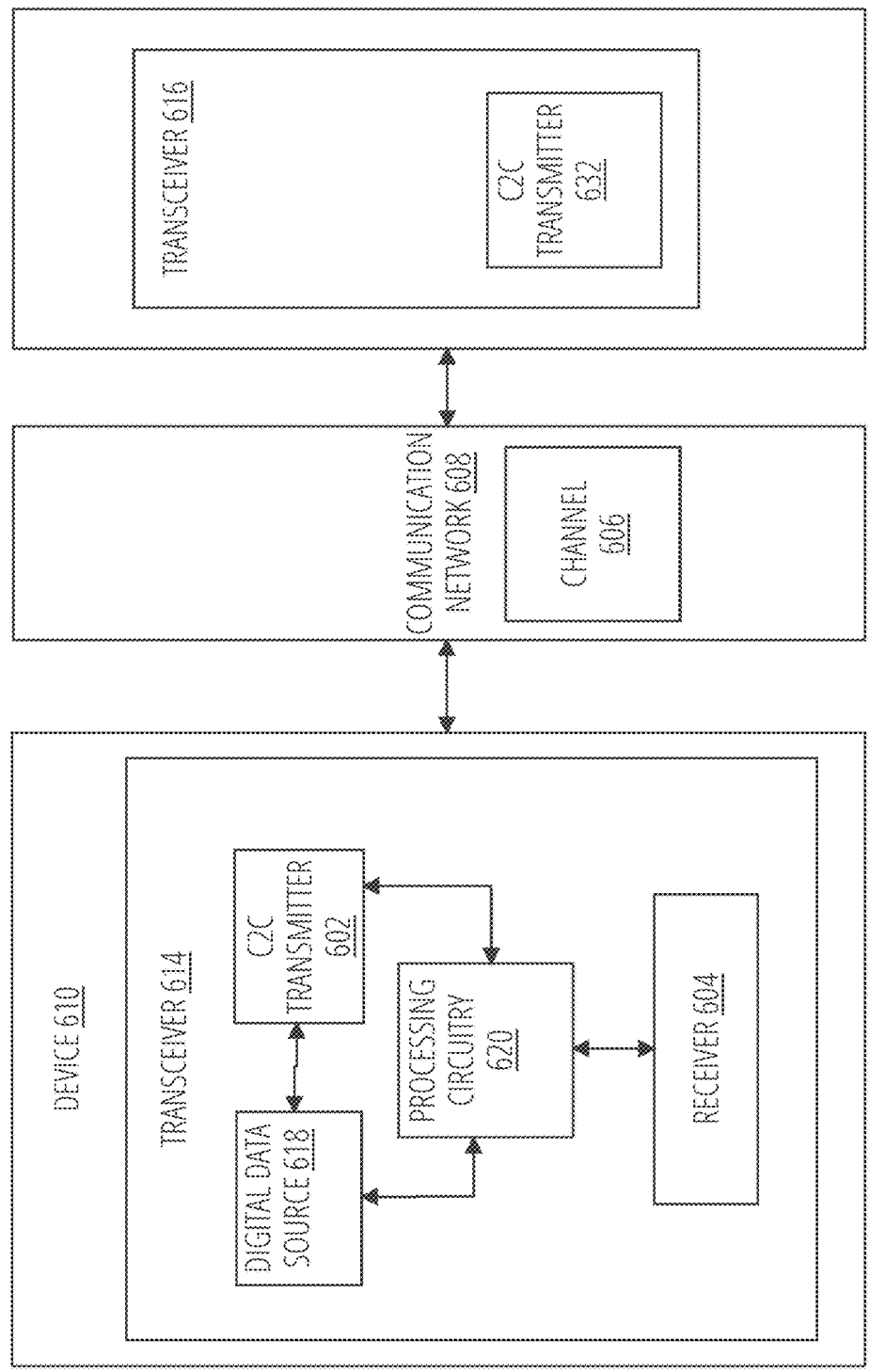
FIG. 6A illustrates an example communication system with a C2C transmitter with a low-swing output driver, in accordance with at least some embodiments.

FIG. 6A illustrates an example communication system 600 with a C2C transmitter 602 with a low-swing output driver, in accordance with some embodiments. The communication system 600 includes a device 610, a communication network 608 including a communication channel 606, and a device 612. In at least one embodiment, the devices 610 and 612 are integrated circuits of a Personal Computer (PC), a laptop, a tablet, a smartphone, a server, a collection of servers, or the like. In some embodiments, the devices 610 and 612 may correspond to any appropriate type of device that communicates with other devices also connected to a common type of communication network 608. According to embodiments, the C2C transmitters 602 and 634 of devices 610 or 612 may correspond to transmitters of a GPU, a switch (e.g., a high-speed network switch), a network adapter, a CPU, a data processing unit (DPU), etc.

Examples of the communication network 608 that may be used to connect the devices 610 and 612 include wires, conductive traces, bumps, terminals, or the like. In one specific, but non-limiting example, the communication network 608 is a network that enables data transmission between the devices 610 and 612 using data signals (e.g., digital, optical, wireless signals), clock signals, or both.

The device 610 includes a transceiver 614 for sending and receiving signals, for example, data signals. The data signals may be digital or optical signals modulated with data or other suitable signals for carrying data.

The transceiver 614 may include a digital data source 618, a C2C transmitter 602, a receiver 604, and processing circuitry 620 that controls the transceiver 614. The digital data source 618 may include suitable hardware and/or software for outputting data in a digital format (e.g., in binary code and/or thermometer code). The digital data output by the digital data source 618 may be retrieved from memory (not illustrated) or generated according to input (e.g., user input). The transceiver 614 can also include a clock source and a second C2C transmitter, as described above.

The transceiver 614 includes suitable software and/or hardware for receiving digital data from the digital data source 618 and outputting data signals according to the digital data for transmission over the communication network 608 to a C2C transmitter 632 of device 612.

The receiver 604 of device 610 may include suitable hardware and/or software for receiving signals, for example, data signals from the communication network 608. For example, the receiver 604 may include components for receiving processing signals to extract the data for storing in a memory. In at least one embodiment, the transceiver 616 includes a receiver and a C2C transmitter 632 with a low-swing output driver. The transceiver 616 receives an incoming signal and samples the incoming signal to generate samples, such as using an analog-to-digital converter (ADC). The ADC can be controlled by a clock-recovery circuit (or clock recovery block) in a closed-loop tracking scheme. The clock-recovery circuit can include a controlled oscillator, such as a voltage-controlled oscillator (VCO) or a digitally-controlled oscillator (DCO) that controls the sampling of the subsequent data by the ADC. Additional details of the C2C transmitters 602 and 632 are described above with respect to FIG. 1 to FIG. 5.

The processing circuitry 620 may comprise software, hardware, or a combination thereof. For example, the processing circuitry 620 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 620 may comprise hardware, such as an application-specific integrated circuit (ASIC). Other non-limiting examples of the processing circuitry 620 include an Integrated Circuit (IC) chip, a CPU, A GPU, a DPU, a microprocessor, a Field Programmable Gate Array (FPGA), a collection of logic gates or transistors, resistors, capacitors, inductors, diodes, or the like. Some or all of the processing circuitry 620 may be provided on a Printed Circuit Board (PCB) or collection of PCBs. It should be appreciated that any appropriate type of electrical component or collection of electrical components may be suitable for inclusion in the processing circuitry 620. The processing circuitry 620 may send and/or receive signals to and/or from other elements of the transceiver 614 to control the overall operation of the transceiver 614.

The transceiver 614 or selected elements of the transceiver 614 may take the form of a pluggable card or controller for the device 610. For example, the transceiver 614 or selected elements of the transceiver 614 may be implemented on a network interface card (NIC).

The device 612 may include a transceiver 616 for sending and receiving signals, for example, data signals over a channel 606 of the communication network 608. The same or similar structure of the transceiver 614 may be applied to transceiver 616, and thus, the structure of transceiver 616 is not described separately.

Although not explicitly shown, it should be appreciated that devices 610 and 612 and the transceiver 614 and transceiver 616 may include other processing devices, storage devices, and/or communication interfaces generally associated with computing tasks, such as sending and receiving data.

Figure 6B:
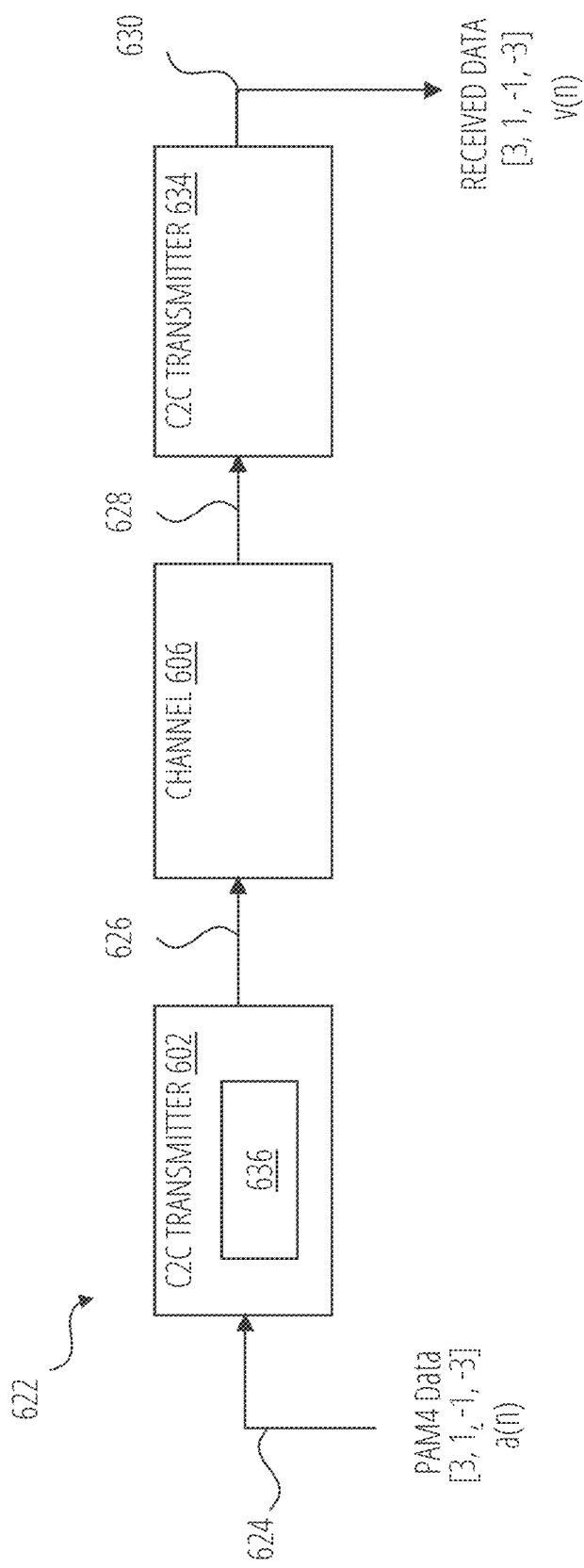
FIG. 6B is a block diagram of a communication system employing a C2C transmitter in a transmitter device, according to at least one embodiment.

FIG. 6B illustrates a block diagram of an example communication system 622 employing a C2C transmitter 602 with a low-swing output driver in a C2C transmitter 634, according to at least one embodiment. In the example shown in FIG. 6B, a Pulse Amplitude Modulation level-4 (PAM4) modulation scheme is employed with respect to the transmission of a signal (e.g., digitally encoded data) from a transmitter (TX) 602 to a receiver (RX) 634 via a communication channel 606 (e.g., a transmission medium). In this example, the C2C transmitter 602 receives an input data 624 (i.e., the input data at time n is represented as "a(n)"), which is modulated in accordance with a modulation scheme (e.g., PAM4) and sends the signal 626 a(n) including a set of data symbols (e.g., symbols −3, −1, 1, 3, where the symbols represent coded binary data). It is noted that while the use of the PAM4 modulation scheme is described herein by way of example, other data modulation schemes can be used in accordance with embodiments of the present disclosure, including, for example, a non-return-to-zero (NRZ) modulation scheme, PAM7, PAM8, PAM16, etc. For example, for an NRZ-based system, the transmitted data symbols consist of symbols −1 and 1, with each symbol value representing a binary bit. This is also known as a PAM level-2 or PAM2 system as there are 2 unique values of transmitted symbols. Typically, a binary bit 0 is encoded as −1, and a bit 1 is encoded as 1 as the PAM2 values.

In the example shown, the PAM4 modulation scheme uses four (4) unique values of transmitted symbols to achieve higher efficiency and performance. The four levels are denoted by symbol values −3, −1, 1, 3, with each symbol representing a corresponding unique combination of binary bits (e.g., 00, 01, 10, 11).

The communication channel 606 is a destructive medium in that the channel acts as a low pass filter which attenuates higher frequencies more than it attenuates lower frequencies, introduces inter-symbol interference (ISI) and noise from cross talk, power supplies, Electromagnetic Interference (EMI), or other sources. The communication channel 606 can be over serial links (e.g., a cable, printed circuit boards (PCBs) traces, copper cables, optical fibers, or the like), read channels for data storage (e.g., hard disk, flash solid-state drives (SSDs), high-speed serial links, deep space satellite communication channels, applications, or the like.

As described above, in some communication systems, the C2C transmitter 602 sends the signal 626 as a data signal with or without a transmitter clock used to generate the data signal. The receiver (RX) 634 receives an incoming signal 628 over the channel 606. The C2C transmitter 602 includes a low-swing output driver 636. The low-swing output driver 636 can be the low-swing output driver 100, 200, 302, 400, 502, 504, as described above. The C2C transmitter 602 with the low-swing output driver 636 can reduce or remove DCD from the signal 626. The C2C transmitter 634 can receive the signal 626 and process the signal 626. The C2C transmitter 634 can output a received signal 630, "v(n)," including the set of data symbols (e.g., symbols −3, −1, 1, 3, wherein the symbols represent coded binary data).

In at least one embodiment, the C2C transmitter 602 can be part of a SerDes IC. The SerDes IC can be a transceiver that converts parallel data to serial data and vice versa. The SerDes IC can facilitate transmission between two devices over serial streams, reducing the number of data paths, wires/traces, terminals, etc. The C2C transmitter 634 can be part of a SerDes IC. The SerDes IC can include a clock-recovery circuit. The clock-recovery circuit can be coupled to an ADC and an equalization block. In another embodiment, the SerDes IC can include an additional equalization block before a symbol detector.

In at least one embodiment, a source synchronous C2C transmitter includes a first signal source and a first output driver that includes a first CMOS amplifier and a first attenuator coupled to an output of the first CMOS amplifier. The source-synchronous C2C transmitter includes a first DCC loop coupled to the first signal source and the first output driver. The first DCC loop can estimate and correct for the first DCD at the output of the first CMOS amplifier.

In at least one embodiment, the source synchronous C2C transmitter can also include a second signal source and a second output driver, including a second CMOS amplifier and a second attenuator coupled to an output of the second CMOS amplifier. A second DCC loop is coupled to the second signal source and the second output driver. The second DCC loop can estimate and correct for a second DCD at the output of the second CMOS amplifier. In at least one embodiment, the first signal source includes a processing device, a data channel, and a first serializer, and the second signal source includes a phased-locked loop (PLL), a clock tree, and a second serializer. The first serializer and the second serializer can be coupled to the same clock tree.

In at least one embodiment, the first DCC loop includes a DCD estimation block coupled to the output of the first CMOS amplifier, a DCC control block coupled to the DCD estimation block, and a DCC component coupled to the DCC control block and the first CMOS amplifier. The source synchronous C2C transmitter may also include a pre-driver coupled between the DCC component and the first CMOS amplifier, and a serializer coupled to the DCC component. The first signal source can be a clock signal source or a data signal source.

In at least one embodiment, a circuit includes a CMOS amplifier, an attenuator coupled to an output of the CMOS amplifier, and a DCD estimation block coupled to an output of the CMOS amplifier to measure DCD at the output of the CMOS amplifier. In a further embodiment, The circuit may also include a DCC control block coupled to the DCD estimation block, and a DCC component block coupled to the DCC control block. The DCC control block can control the DCC component to correct an input signal of the CMOS amplifier based on the DCD measured at the output of the CMOS amplifier. The circuit may also include a pre-driver coupled between the DCC component and the CMOS amplifier, and a serializer coupled to the DCC component. The attenuator can be a passive CTLE circuit or a resistive attenuator, as described herein.

Figure 7:
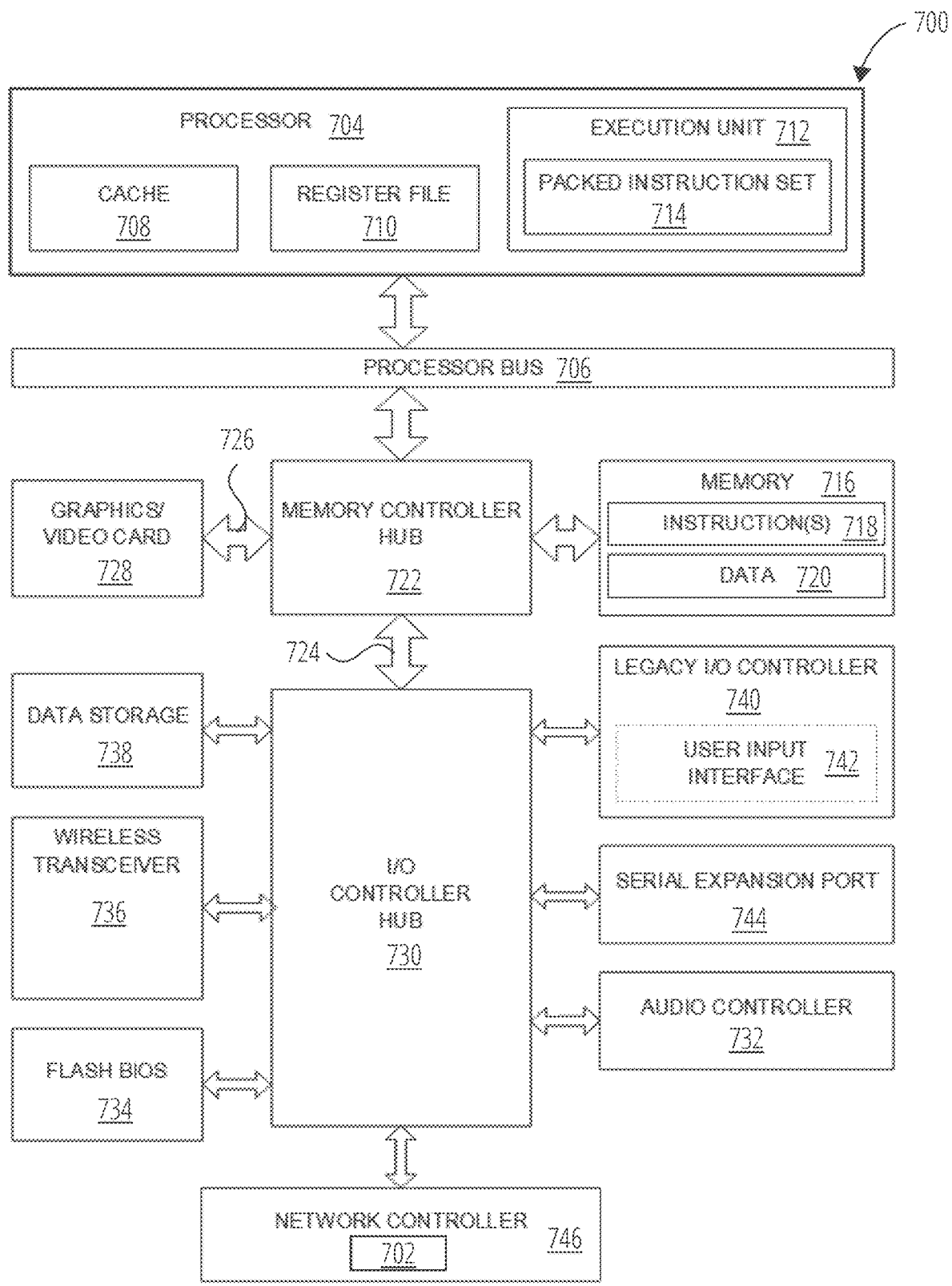
FIG. 7 illustrates an example computer system, including a low-swing transmitter of a C2C SERDES interface, in accordance with at least some embodiments

FIG. 7 illustrates an example computer system 700, including a low-swing transmitter 702 of a C2C SERDES interface, in accordance with at least some embodiments. The low-swing transmitter 702 can be any of the C2C transmitters, including a low-swing output driver, as described herein. In at least one embodiment, computer system 700 may be a system with interconnected devices and components, a System on Chip (SoC), or some combination. In at least one embodiment, computer system 700 is formed with a processor 704 that may include execution units to execute an instruction. In at least one embodiment, computer system 700 may include, without limitation, a component, such as a processor 704, to employ execution units including logic to perform algorithms for processing data. In at least one embodiment, computer system 700 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 700 may execute a version of WINDOWS' operating system available from Microsoft Corporation of Redmond, Wash., although other operating systems (UNIX and Linux, for example), embedded software, and/or graphical user interfaces, may also be used.

In at least one embodiment, computer system 700 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 700 may be used in devices such as graphics processing units (GPUs), network adapters, central processing units, and network devices such as switches (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 700 may include, without limitation, processor 704 that may include, without limitation, one or more execution units 807 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 700 is a single processor desktop or server system. In at least one embodiment, computer system 700 may be a multiprocessor system. In at least one embodiment, processor 704 may include, without limitation, a CISC microprocessor, a RISC microprocessor, a VLIW microprocessor, and a processor implementing a combination of instruction sets, or any other processor device, such as a digital signal processor, for example. In at least one embodiment, processor 704 may be coupled to a processor bus 706 that may transmit data signals between processor 704 and other components in computer system 700.

In at least one embodiment, processor 704 may include, without limitation, a Level 1 ("L1") internal cache memory ("cache") 708. In at least one embodiment, processor 704 may have a single internal cache or multiple levels of internal cache. In at least one embodiment, cache memory may reside external to processor 704. In at least one embodiment, processor 704 may also include a combination of both internal and external caches. In at least one embodiment, a register file 710 may store different types of data in various registers including, without limitation, integer registers, floating-point registers, status registers, and instruction pointer register.

In at least one embodiment, execution unit 712, including, without limitation, logic to perform integer and floating-point operations, also resides in processor 704. Processor 704 may also include a microcode ("ucode") read only memory ("ROM") that stores microcode for certain macro instructions. In at least one embodiment, execution unit 712 may include logic to handle a packed instruction set 714. In at least one embodiment, by including packed instruction set 714 in an instruction set of a general-purpose processor 704, along with associated circuitry to execute instructions, operations used by many multimedia applications may be performed using packed data in a general-purpose processor 704. In at least one embodiment, many multimedia applications may be accelerated and executed more efficiently by using the full width of a processor's data bus for performing operations on packed data, which may eliminate the need to transfer smaller units of data across a processor's data bus to perform one or more operations one data element at a time.

In at least one embodiment, execution unit 712 may also be used in microcontrollers, embedded processors, graphics devices, DSPs, and other types of logic circuits. In at least one embodiment, computer system 700 may include, without limitation, a memory 716. In at least one embodiment, memory 716 may be implemented as a Dynamic Random Access Memory (DRAM) device, a Static Random Access Memory (SRAM) device, flash memory device, or other memory devices. Memory 716 may store instruction(s) 718 and/or data 720 represented by data signals that may be executed by processor 704.

In at least one embodiment, a system logic chip may be coupled to a processor bus 706 and memory 716. In at least one embodiment, the system logic chip may include, without limitation, a memory controller hub ("MCH") 722, and processor 704 may communicate with MCH 722 via processor bus 706. In at least one embodiment, MCH 722 may provide a high bandwidth memory path to memory 716 for instruction and data storage and for storage of graphics commands, data, and textures. In at least one embodiment, MCH 722 may direct data signals between processor 704, memory 716, and other components in computer system 700 and may bridge data signals between processor bus 706, memory 716, and a system I/O 724. In at least one embodiment, a system logic chip may provide a graphics port for coupling to a graphics controller. In at least one embodiment, MCH 722 may be coupled to memory 716 through high bandwidth memory path, and graphics/video card 728 may be coupled to MCH 722 through an Accelerated Graphics Port ("AGP") interconnect 726.

In at least one embodiment, computer system 700 may use system I/O 724, which is a proprietary hub interface bus to couple MCH 722 to I/O controller hub ("ICH") 730. In at least one embodiment, ICH 730 may provide direct connections to some I/O devices via a local I/O bus. In at least one embodiment, a local I/O bus may include, without limitation, a high-speed I/O bus for connecting peripherals to memory 716, a chipset, and processor 704. Examples may include, without limitation, an audio controller 732, a firmware hub ("flash BIOS") 734, a wireless transceiver 736, a data storage 738, a legacy I/O controller 740 containing a user input interface 742, a keyboard interface, a serial expansion port 744, such as a USB, and a network controller 746, including the SERDES interface with the low-swing transmitter 702 as described herein. In at least one embodiment, the network controller 746 includes the C2C transmitter with a low-swing output driver as described herein.

Data storage 738 may comprise a hard disk drive, a floppy disk drive, a CD-ROM device, a flash memory device, or other mass storage devices.

In at least one embodiment, FIG. 7 illustrates a computer system 700, which includes interconnected hardware devices or "chips." In at least one embodiment, FIG. 7 may illustrate an example SoC. In at least one embodiment, devices illustrated in FIG. 7 may be interconnected with proprietary interconnects, standardized interconnects (e.g., PCIe), or some combination thereof. In at least one embodiment, one or more components of computer system 700 are interconnected using compute express link ("CXL") interconnects.

Other variations are within the spirit of the present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B, and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B, and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, the terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulates and/or transforms data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As a non-limiting example, a "processor" may be a network device. A "computing platform" may comprise one or more processors. As used herein, "software" processes may include, for example, software and/or hardware entities that perform work over time, such as tasks, threads, and intelligent agents. Also, each process may refer to multiple processes for continuously or intermittently carrying out instructions in sequence or in parallel. In at least one embodiment, the terms "system" and "method" are used herein interchangeably insofar as the system may embody one or more methods, and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways, such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface, or an inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A transmitter comprising:
   a first output driver comprising a first complementary metal-oxide semiconductor (CMOS) amplifier and a first attenuator coupled to an output of the first CMOS amplifier, the first CMOS amplifier to receive an input signal and output an intermediate signal to the first attenuator, and the first attenuator to receive the intermediate signal and output an output signal having a signal swing that is less than a signal swing of the input signal, wherein the first attenuator is a passive continuous-time linear equalization (CTLE) circuit; and
   a first duty cycle correction (DCC) loop coupled to the first output driver, wherein the first DCC loop is to estimate first duty cycle distortion (DCD) in the intermediate signal output by the first CMOS amplifier.

2. The transmitter of claim 1, wherein the first DCC loop comprises:
   a DCD estimation block coupled to the output of the first CMOS amplifier;
   a DCC control block coupled to the DCD estimation block; and
   a DCC component coupled to the DCC control block and the first output driver.

3. The transmitter of claim 2, further comprising:
   a pre-driver coupled between the DCC component and the first output driver; and
   a serializer coupled to the DCC component.

4. The transmitter of claim 1, wherein the input signal is a clock signal.

5. The transmitter of claim 1, wherein the input signal is a data signal.

6. The transmitter of claim 1, further comprising:
   a second output driver comprising a second CMOS amplifier and a second attenuator coupled to an output of the second CMOS amplifier, the second CMOS amplifier to receive a second input signal and output a second intermediate signal to the second attenuator, and the second attenuator to receive the second intermediate signal and output a second output signal having a signal swing that is less than a signal swing of the second input signal; and
   a second DCC loop coupled to the second output driver, wherein the second DCC loop is to estimate second DCD in the second intermediate signal output by the second CMOS amplifier.

7. The transmitter of claim 6, wherein the input signal is a data signal, and the second input signal is a clock signal.

8. The transmitter of claim 6, further comprising:
   a first serializer coupled to the first DCC loop;
   a second serializer coupled to the second DCC loop; and
   a clock source coupled to the first serializer and the second serializer.

9. A device comprising:
   a phased-locked loop (PLL);
   a clock tree coupled to the PLL;
   a first signal source to generate an input signal, wherein the first signal source comprises a first serializer to receive a clock signal from the clock tree;
   a first output driver coupled to the first signal source, wherein the first output driver comprises a first complementary metal-oxide semiconductor (CMOS) amplifier and a first attenuator coupled to an output of the first CMOS amplifier, the first CMOS amplifier to receive the input signal and output an intermediate signal to the first attenuator, and the first attenuator to receive the intermediate signal and output an output signal having a signal swing that is less than a signal swing of the input signal; and
   a first duty cycle correction (DCC) loop coupled to the first output driver, wherein the first DCC loop is to estimate first duty cycle distortion (DCD) in the intermediate signal output by the first CMOS amplifier.

10. The device of claim 9,
    wherein the first signal source further comprises a processing device and a data channel.

11. The device of claim 9, further comprising:
    a second signal source to generate a second input signal;
    a second output driver coupled to the second signal source, wherein the second output driver comprises a second CMOS amplifier and a second attenuator coupled to an output of the second CMOS amplifier, the second CMOS amplifier to receive the second input signal and output a second intermediate signal to the second attenuator, and the second attenuator to receive the second intermediate signal and output a second output signal having a signal swing that is less than a signal swing of the second input signal; and
    a second DCC loop coupled to the second output driver, wherein the second DCC loop is to estimate second DCD in the second intermediate signal output by the second CMOS amplifier.

12. The device of claim 11, wherein the output signal is a data signal, and wherein the second output signal is an output clock signal.

13. The device of claim 11, wherein the second signal source comprises:
    a second serializer, wherein the second serializer is to receive the clock signal from the clock tree.

14. The device of claim 9, wherein the first DCC loop comprises:
    a DCD estimation block coupled to the output of the first CMOS amplifier;
    a DCC control block coupled to the DCD estimation block; and
    a DCC component coupled to the DCC control block and the first CMOS amplifier.

15. The device of claim 14, further comprising:
    a pre-driver coupled between the DCC component and the first CMOS amplifier; and
    a first serializer is coupled to the DCC component.

16. The device of claim 9, wherein the first attenuator is a resistive attenuator.

17. The device of claim 9, wherein the first attenuator is a passive continuous-time linear equalization (CTLE) circuit.

18. A method of operating a transmitter, the method comprising:
    receiving an input signal at a first complementary metal-oxide semiconductor (CMOS) amplifier of a first output driver;
    outputting by the first CMOS amplifier, an intermediate signal to a first attenuator of the first output driver, wherein the first attenuator is a passive continuous-time linear equalization (CTLE) circuit;
    receiving, by the first attenuator, the intermediate signal from the first CMOS amplifier;
    outputting, by the first attenuator, an output signal having a signal swing that is less than a signal swing of the input signal;

receiving, by a first duty cycle correction (DCC) loop, the intermediate signal from the first CMOS amplifier; and estimating, by the DCC loop, first duty cycle distortion (DCD) in the intermediate signal output by the first CMOS amplifier.

19. The method of claim 18, further comprising correcting, by the DCC loop, the first DCD in the intermediate signal.

20. The method of claim 18, further comprising:

receiving a second input signal at a second CMOS amplifier of a second output driver;

outputting by the second CMOS amplifier, a second intermediate signal to a second attenuator of the second output driver;

receiving, by the second attenuator, the second intermediate signal from the second CMOS amplifier;

outputting, by the second attenuator, a second output signal having a signal swing that is less than a signal swing of the second input signal;

receiving, by a second DCC loop, the second intermediate signal from the second CMOS amplifier; and estimating, by the second DCC loop, second DCD in the second intermediate signal output by the second CMOS amplifier.

* * * * *